US007158419B2

(12) United States Patent
Lee et al.

(10) Patent No.: US 7,158,419 B2
(45) Date of Patent: Jan. 2, 2007

(54) METHODS OF FABRICATING FLASH MEMORY DEVICES INCLUDING MULTIPLE DUMMY CELL ARRAY REGIONS

(75) Inventors: Chang-Hyun Lee, Gyeonggi-do (KR); Jung-In Han, Gyeonggi-do (KR); Kwang-Won Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 10/918,966

(22) Filed: Aug. 16, 2004

(65) Prior Publication Data

US 2005/0041477 A1 Feb. 24, 2005

(30) Foreign Application Priority Data

Aug. 19, 2003 (KR) ..................... 10-2003-0057368

(51) Int. Cl.
*G11C 16/04* (2006.01)
*G11C 16/06* (2006.01)

(52) U.S. Cl. .......................... 365/185.29; 365/185.17; 365/185.2

(58) Field of Classification Search ............ 365/185.29
See application file for complete search history.

(56) References Cited

U.S. PATENT DOCUMENTS 5,463,587 A * 10/1995 Maruyama ............. 365/185.22
5,966,330 A * 10/1999 Tang et al. .............. 365/185.2
6,185,131 B1 * 2/2001 Kouchi .................... 365/185.2
6,256,228 B1 * 7/2001 Hirano .................. 365/185.11
6,407,953 B1 6/2002 Cleeves
2003/0072191 A1 * 4/2003 Kamei ........................ 365/200
2004/0113199 A1 * 6/2004 Hazama et al. ............. 257/317
2005/0057972 A1 * 3/2005 Taito et al. ............ 365/185.28

FOREIGN PATENT DOCUMENTS

JP 59-168992 9/1984
JP 61-214559 9/1986

* cited by examiner

*Primary Examiner*—Son L. Mai
(74) *Attorney, Agent, or Firm*—Myers Bigel Sibley & Sajovec

(57) ABSTRACT

Methods for erasing an integrated circuit memory device having a cell array region that includes a main cell array region, a first dummy cell array region on a first side of the main cell array region and a second dummy cell array region on a second side of the main cell array region are provided. A first erasure voltage is applied to a plurality of main control gate electrodes in the main cell array region. The plurality of main control gate electrodes include a first outermost main control gate electrode adjacent to the first dummy cell array region and a second outermost main control gate electrode adjacent to the second dummy cell array region. A second erasure voltage is applied to an integrated circuit substrate in the main cell array region. The second erasure voltage is greater than the first erasure voltage. A third erasure voltage is applied to a first inner dummy control gate electrode adjacent to the first outermost main control gate electrode and a second inner dummy control gate electrode adjacent to the second outermost main control gate electrode. The third erasure voltage is less than the second erasure voltage. Related devices are also provided.

16 Claims, 12 Drawing Sheets

Ve3 Ve1 Ve3
MG1
55a MFG 57 MWL 59a 59a
61 59 DWL 57 DFG 55a DG1 61 59 Ve2
53 DG2 MG2 MG3 MGn-1 MGn DG3 DG4 53
S D S D S D S
51 51
DA1 M1 DB1

Ve3
Ve1
Ve2
61
59
59a
53
51
DG4
DG3
DB1
S
MGn
D
MGn-1
M1
MG3
MG2
MWL
57
MG1
MFG
55a
DG2
DA1
DWL
DFG
DG1

61
59
MGn
MWL
57
MFG
55a
54a
53
51
54
M3
54a
60
DB3
DWL
57
DFG
55a
54a

METHODS OF FABRICATING FLASH MEMORY DEVICES INCLUDING MULTIPLE DUMMY CELL ARRAY REGIONS

CLAIM OF PRIORITY

This application is related to and claims priority from Korean Patent Application No. 10-2003-57368, filed on Aug. 19, 2003, the disclosure of which is hereby incorporated herein by reference as if set forth in its entirety.

FIELD OF THE INVENTION

The present invention relates to integrated circuit devices and methods of operating the same and, more particularly, to flash memory devices and methods of operating the same.

BACKGROUND OF THE INVENTION

Integrated circuit memory devices used for storing data can typically be categorized as either volatile memory devices or nonvolatile memory devices. Volatile memory devices generally lose any stored data when power supplied to the volatile memory device is interrupted. Nonvolatile memory devices typically retain any stored data even when power supplied to the nonvolatile memory device is interrupted. Accordingly, nonvolatile memory devices have been widely used in, for example, memory cards, mobile telecommunication systems and the like, for their memory retention capabilities.

Integrated circuit memory devices including nonvolatile memory devices typically include cell array regions having a plurality of main cells. The patterns in the cell array regions are generally formed using a photolithography process. Accordingly, main cells located at the edge of the cell array region may be damaged during the photolithography process. The damaged cells may cause non-uniform characteristics of some or all of the main cells in the cell array region.

Recently, manufacturers have begun to include a dummy cell array region surrounding the main cell array region to address the problems caused during the photolithography process discussed above. Referring now to FIG. 1, a cross-sectional view illustrating a portion of a cell array region of conventional NOR-type flash memory devices will be discussed. As illustrated in FIG. 1, the cell array region includes a main cell array region M and a dummy cell array region D adjacent thereto. A p-type well region 3 is provided on an integrated circuit substrate 1. The p-type well region 3 is provided on the cell array region.

A device isolation layer (not shown) is provided at a predetermined region of the p-type well region 3 to define a plurality of parallel active regions. A plurality of parallel gate patterns are disposed to cross over the active regions. The gate patterns may include a plurality of parallel main gate patterns G1 and G2 located in the main cell array region M, and dummy gate patterns G1' and G2' located in the dummy cell array region D. Each of the main gate patterns G1 and G2 includes a main word line WL crossing over the active regions, main floating gates FG between the main word line WL and the active regions, a tunnel oxide layer 5 between the main floating gates FG and the active regions, and an inter-gate insulating layer 7 between the main word line WL and the main floating gates FG. The main word lines WL correspond to main control gate electrodes. Similarly, each of the dummy gate patterns G1' and G2' includes a dummy word line WL' crossing over the active regions, dummy floating gates FG' between the dummy word line WL' and the active regions, a tunnel oxide layer 5 between the dummy floating gates FG' and the active regions, and an inter-gate insulating layer 7 between the dummy word line WL' and the dummy floating gates FG'. The dummy word lines WL' correspond to dummy control gate electrodes.

A source region S and a drain region D are alternately disposed at the active region between the main gate patterns G1 and G2. Further, the source region S is provided at the active region between the outermost main gate pattern of the main gate patterns G1 and G2 and the dummy gate pattern G2' adjacent thereto. As a result, a single main cell is formed at every intersection of the main word lines WL and the active regions. An interlayer insulating layer 9 is provided on the integrated circuit substrate having the gate patterns G1', G2', G1 and G2 and the source/drain regions S and D. A plurality of parallel bit lines 11 are provided on the interlayer insulating layer 9, and the bit lines 11 cross over the gate patterns G1', G2', G1 and G2. Each of the bit lines 11 is electrically coupled to the drain regions D through bit line contact holes (not shown) in the interlayer insulating layer 9.

The erasing operation of the main cells of the conventional NOR-type flash memory device may be achieved by applying a first erasure voltage Ve1 to the main word lines WL, and applying a second erasure voltage Ve2, higher than the first erasure voltage Ve1, to the p-type well region 3 and the dummy word lines WL'. For example, the first erasure voltage Ve1 and the second erasure voltage Ve2 may be negative 9 volts and positive 7 volts, respectively. In this case, the outermost main cells sharing the outermost main gate pattern, for example, the first main gate pattern G1, may not be sufficiently erased due to the parasitic capacitance $C_{FG}$ between the main floating gate FG of the first main gate pattern G1 and the dummy floating gate FG' of the second dummy gate pattern G2' adjacent to the first main gate pattern G1. In other words, the voltage induced at the main floating gates FG of the outermost main cells may be higher than the voltage induced at the floating gates FG of the inner main cells surrounded by the outermost main cells due to the presence of the parasitic capacitance $C_{FG}$.

Referring now to FIG. 2, an equivalent circuit illustrating a coupling ratio of the outermost main cell when the first Ve1 and second Ve2 erasure voltages are applied will be discussed. A first capacitor Ci and a second capacitor Ct are serially connected between the main word line WL (main control gate electrode) of the outermost main cell and the p-type well region 3. The first capacitor Ci corresponds to a parasitic capacitance of the inter-gate insulating layer 7 between the main word line WL and the main floating gate FG and the second capacitor Ct corresponds to a parasitic capacitance of the tunnel oxide layer 5 between the main floating gate FG and the p-type well region 3. Thus, a node $V_F$ between the first and second capacitors Ci and Ct corresponds to the main floating gate FG. Further, a third capacitor Cp, which is connected in parallel to the second capacitor Ct, is provided between the main floating gate FG and the P-type well region 3. As illustrated, the third capacitor Cp includes first and second dummy capacitors Ci' and Ct' connected in parallel between the dummy floating gate FG' and the p-type well region 3 and a parasitic capacitance $C_{FG}$ provided between the main floating gate FG and the dummy floating gate FG' adjacent thereto. The first dummy capacitor Ci' corresponds to parasitic capacitance of the inter-gate insulating layer 7 between the dummy word line WL' of the dummy cell adjacent to the outermost main cell and the dummy floating gate FG', and the second dummy capacitor Ct' corresponds to a capacitance of the tunnel oxide layer 5 between the dummy floating gate FG' of the dummy cell and the p-type well region 3.

In the equivalent circuit illustrated in FIG. 2, the floating gate voltage $V_F$ induced at the main floating gate FG of the outermost main cell during the erasing operation can be expressed by the following equation:

$$V_F=\{C1\times Ve1+(C2+C3)\times Ve2\}\div(C1+C2+C3) \quad \text{(Equation 1)}$$

where C1 is a capacitance of the first capacitor Ci, C2 is a capacitance of the second capacitor Ct, and C3 is a capacitance of the third capacitor Cp.

As illustrated by Equation 1, if the third capacitance C3 increases, the floating gate voltage $V_F$ of the outermost main cell has a high voltage close to the second erasure voltage Ve2 applied to the p-type well region 3. In other words, the electric field applied to the tunnel oxide layer of the outermost main cells during the erasing operation is decreased relative to the electric field applied to the tunnel oxide layer of the inner main cells surrounded by the outermost main cells. This may cause an erase operation to fail in the outermost main cells.

Dummy cells used to improve reliability of a nonvolatile memory device are discussed in Japanese Laid-open Patent No. 59-168992 to Minoru, entitled Nonvolatile Memory and Its Address System.

SUMMARY OF THE INVENTION

Embodiments of the present invention provide methods for erasing an integrated circuit memory device having a cell array region that includes a main cell array region, a first dummy cell array region on a first side of the main cell array region and a second dummy cell array region on a second side of the main cell array region. The second dummy cell array region is separate from the first dummy cell array region. A first erasure voltage is applied to a plurality of main control gate electrodes in the main cell array region. The plurality of main control gate electrodes include a first outermost main control gate electrode adjacent to the first dummy cell array region and a second outermost main control gate electrode adjacent to the second dummy cell array region. A second erasure voltage is applied to an integrated circuit substrate in the main cell array region. The second erasure voltage is greater than the first erasure voltage. A third erasure voltage is applied to a first inner dummy control gate electrode adjacent to the first outermost main control gate electrode and a second inner dummy control gate electrode adjacent to the second outermost main control gate electrode. The third erasure voltage is less than the second erasure voltage.

In some embodiments of the present invention, the first erasure voltage may be a negative voltage and the second erasure voltage may be a positive voltage. The third erasure voltage may be substantially equal to the first erasure voltage and may be greater than the first erasure voltage. In certain embodiments of the present invention, the first erasure voltage may be about negative 7 volts and the second erasure voltage may be about positive 9 volts. The third erasure voltage may be about negative 7 volts. The third erasure voltage may be greater than about negative 7 volts and less than about 0 volts.

In further embodiments of the present invention, the memory device may further include a first outer dummy control gate electrode adjacent to the first inner dummy control gate electrode and a second outer dummy control gate electrode adjacent to the second inner dummy control gate electrode. The third erasure voltage may be applied to the first and second inner dummy control gate electrodes and the first and second outer dummy cell array regions. The integrated circuit substrate may include a p-type integrated circuit substrate.

While the present invention is described above primarily with reference to methods of erasing integrated circuit memory devices, related integrated circuit memory devices are also provided herein.

DETAILED DESCRIPTION OF EMBODIMENTS OF THE PRESENT INVENTION

Figure 1:
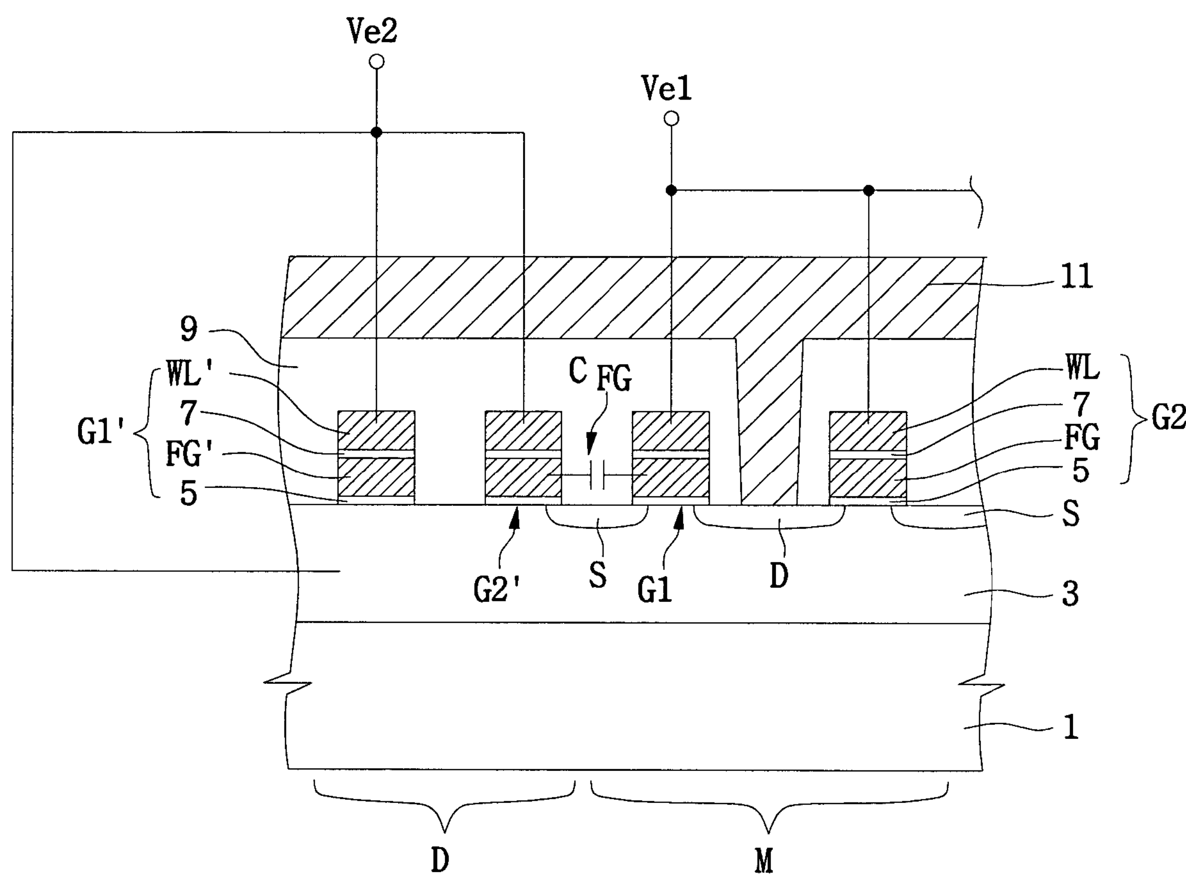
FIG. 1 is a cross-section illustrating conventional NOR-type flash memory devices having dummy cells.
Figure 2:
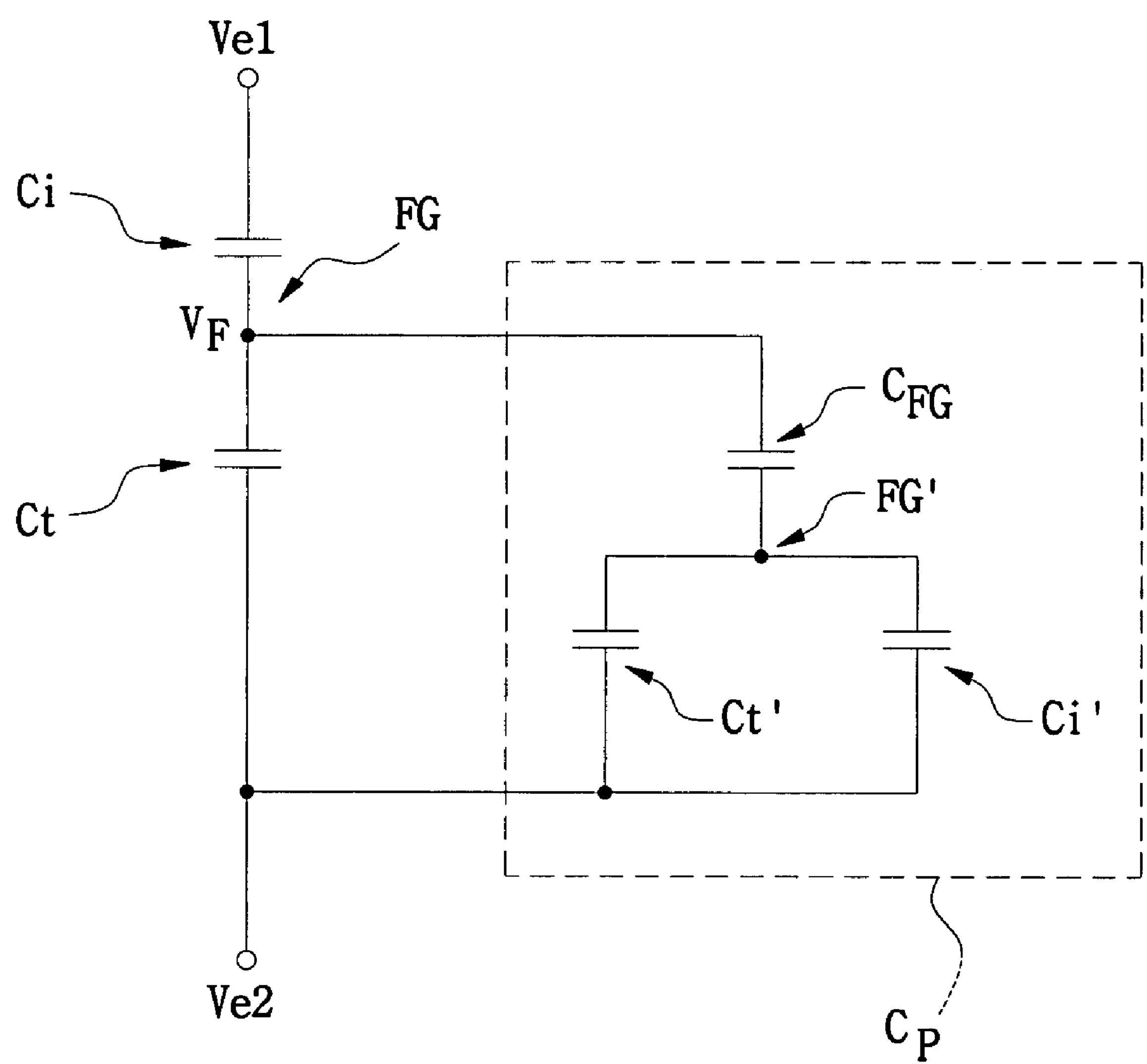
FIG. 2 is an equivalent circuit diagram illustrating a coupling ratio of an outermost main cell of the conventional NOR-type flash memory devices illustrated in FIG. 1.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention will now be discussed with reference to FIGS. 3 through 10. Embodiments of the present invention provide integrated circuit memory devices including a main cell array region and first and second dummy cell array regions on either side of the main cell array region. A first erasure voltage is applied to a plurality of main control gate electrodes in a main cell array region, a second erasure voltage is applied to an integrated circuit substrate in the main cell array region and a third erasure voltage is applied to a first inner dummy control gate electrode and a second inner dummy control gate electrode. The third eraser voltage applied to the first and second inner dummy control gate electrodes is lower than the second voltage applied to the integrated circuit substrate. Accordingly, the erase threshold voltages of the main cells may be lowered, which may increase a read margin of the integrated circuit memory device as discussed further herein.

Figure 3:
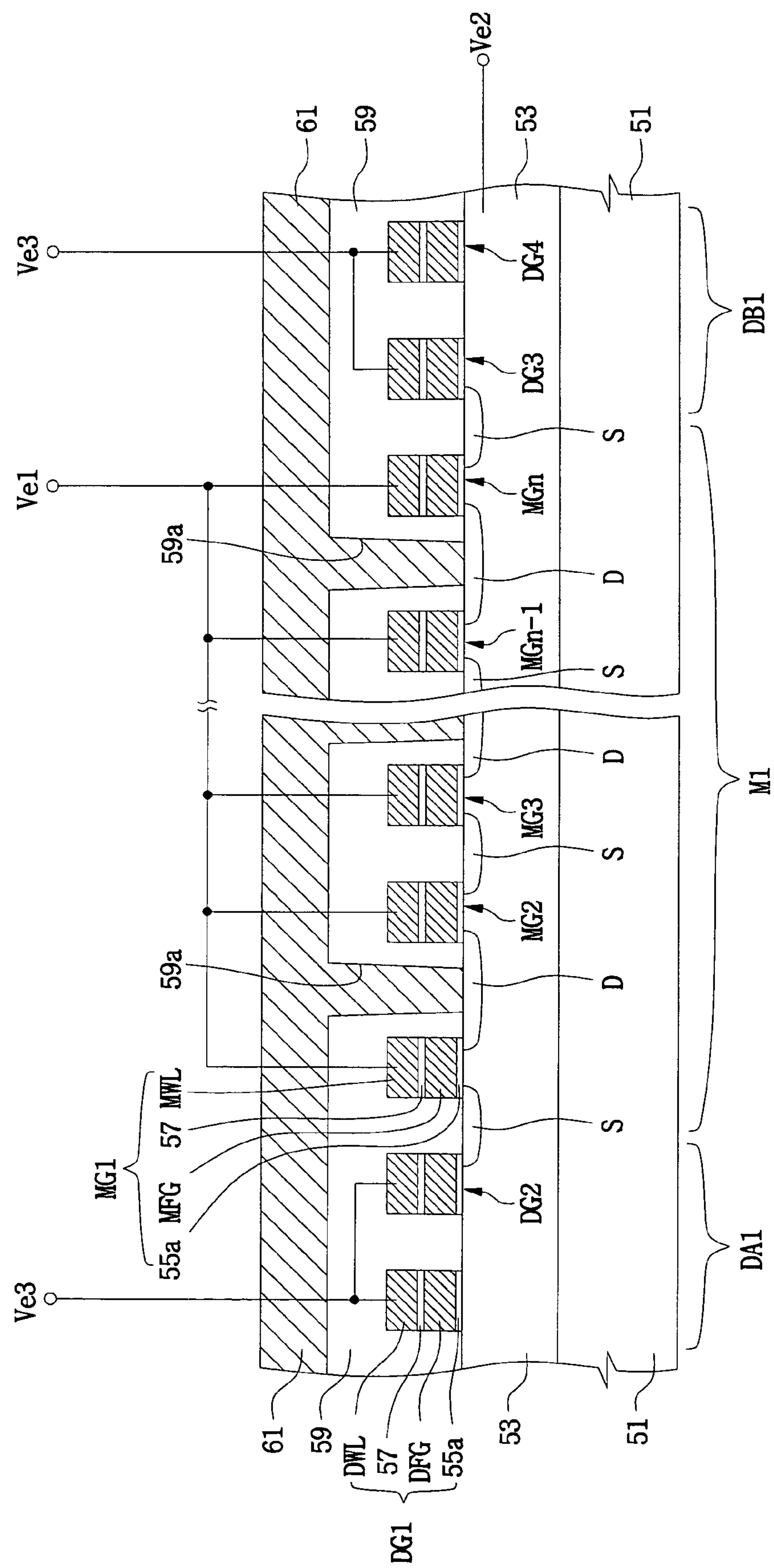
FIG. 3 is a cross-section of NOR-type flash memory devices according to some embodiments of the present invention.

Referring now to FIG. 3, a cross-sectional view illustrating methods of erasing NOR-type flash memory devices according to some embodiments of the present invention will be discussed. As illustrated in FIG. 3, the integrated circuit substrate 51 is divided into a main cell array region M1, and first and second dummy cell array regions DA1 and DA2 disposed on either side of the main cell array region. A p-type well region 53 is provided on the integrated circuit substrate 51 in the main cell array region M1 and the dummy cell array regions DA1 and DB1. A device isolation layer (not shown) is provided on the integrated circuit substrate 51 having the p-type well region 53 and defines a plurality of parallel active regions in the main cell array region M1 extending into the first and second dummy cell array regions DA1 and DB1. A plurality of parallel main gate patterns, for example, n-number of parallel main gate patterns MG1, MG2, MG3 . . . MGn-1 and MGn, are provided on the main cell array region M1. The plurality of main gate patterns MG1, MG2, MG3 . . . MGn-1 and MGn cross over the active regions.

Each of the plurality of main gate patterns MG1, MG2, MG3 . . . MGn-1 and MGn may include a main word line MWL crossing over the active regions and the device isolation layer between the active regions, a main floating gate MFG between the main word line MWL and the active regions, an inter-gate insulating layer 57 between the main floating gate MFG and the main word line MWL, and a tunnel insulating layer 55*a* between the main floating gate MFG and the active regions. The main word lines MWL correspond to main control gate electrodes. The plurality of main gate patterns MG1, MG2, MG3 . . . MGn-1 and MGn include a first main gate pattern MG1 adjacent to the first dummy cell array region DA1 and an nth main gate pattern MGn adjacent to the second dummy cell array region DB1. The main word line MWL of the first main gate pattern MG1 may be referred to herein as a first outermost main control gate electrode, and the main word line MWL of the nth main gate pattern MGn may be referred herein to as a second outermost main control gate electrode.

As further illustrated in FIG. 3, first and second groups of dummy gate patterns are provided on the first and second dummy cell array regions DA1 and DB1, respectively. The first and second groups of dummy gate patterns are parallel to the main gate patterns MG1, MG2, MG3 . . . MGn-1 and MGn. In embodiments of the present invention illustrated in FIG. 3, a first group of dummy gate patterns may be provided on the first dummy cell array region DA1 and a second group of dummy gate patterns may be provided in the second dummy cell array region DB1. The first group of dummy gate patterns may include a pair of dummy gate patterns, for example, first and second dummy gate patterns DG1 and DG2 and the second group of dummy gate patterns may also include a pair of dummy gate patterns, for example, third and fourth dummy gate patterns DG3 and DG4. It will be understood that embodiments of the present invention illustrated in FIG. 3 are provided for exemplary purposes only and embodiments of the present invention should not be limited to this configuration. For example, some embodiments of the present invention may include one dummy gate pattern or more than two dummy gate patterns without departing from the scope of the present invention.

As illustrated in FIG. 3, each of the dummy gate patterns DG1, DG2, DG3 and DG4 includes a dummy word line DWL crossing over the active regions and a dummy floating gate DFG between the dummy word line DWL and the active regions, an inter-gate insulating layer 57 between the dummy floating gate DFG and the dummy word line DWL, and a tunnel insulating layer 55*a* between the dummy floating gates DFG and the active regions. In some embodiments of the present invention, the tunnel insulating layer 55*a* may be a thermal oxide layer. The second and third dummy gate patterns DG2 and DG3 are placed adjacent to the main cell array region M1. The dummy word lines DWL correspond to dummy control gate electrodes. Accordingly, the dummy control gate electrodes of the second and third dummy gate patterns DG2 and DG3 may be referred to herein as a first inner dummy control gate electrode and a second inner dummy control gate electrode, respectively.

In each of the active regions, source regions S and drain regions D are alternately provided on the active regions between the main gate patterns MG1, MG2, MG3 . . . MGn-1 and MGn. For example, a drain region D is provided on the active region between the first and second main gate patterns MG1 and MG2, and a source region S is provided on the active region between the second and third main gate patterns MG2 and MG3. As illustrated in FIG. 3, a source region S is also provided on the active region between the second dummy gate pattern DG2 and the first main gate pattern MG1 in order to operate the main cells formed at the regions where the first main gate pattern MG1 and the active regions intersect. Similarly, a source region S is also provided at the active region between the nth main gate pattern MGn and the third dummy gate pattern DG3. Accordingly, a plurality of main cells are provided at the regions where the main gate patterns MG1, MG2, MG3 . . . MGn-1 and MGn and the active regions intersect.

An interlayer insulating layer 59 is provided on the integrated circuit substrate 51 having the source S and drain D regions and the gate patterns. A plurality of parallel bit lines 61 are provided on the interlayer insulating layer 59. The bit lines 61 overlap the active regions, thereby crossing over the gate patterns. Each of the bit lines 61 is electrically coupled to the drain regions D through bit line contact holes 59*a* in the interlayer insulating layer 59. The source regions S are electrically connected to each other through a common source line (not shown).

Erasing methods according to some embodiments of the present invention will now be discussed with respect embodiments of the NOR-type flash memory devices illustrated in FIG. 3. A first erasure voltage Ve 1may be applied to the main word lines MWL, i.e., the main control gate electrodes, a second erasure voltage Ve2, higher than the first erasure voltage Ve1, may be applied to the p-type well region 53 of the integrated circuit substrate 51, and a third erasure voltage Ve3, less than the second erasure voltage Ve2, may be applied to at least the first and second inner dummy control gate electrodes, i.e., the dummy word lines DWL of the second and third dummy gate patterns DG2 and DG3. In some embodiments of the present invention, the first erasure voltage Ve 1may be a negative voltage. For example, the first erasure voltage Ve 1may be about negative 7 volts. Further, the second erasure voltage Ve2 may be a positive voltage. For example, the second erasure voltage Ve2 may be about positive 9 volts. Furthermore, the third erasure voltage Ve3 may be equal to the first erasure voltage Ve1 or a voltage within the range of the first erasure voltage Ve1 to the second erasure voltage Ve2. The third erasure voltage Ve3 may be applied to all of the dummy word lines DWL as shown in FIG. 3.

During the erasing operation described above, the main cells sharing the second main gate pattern MG2 to (n-1)th main gate patterns MGn-1 may be erased using, for example, a Fowler-Nordheim (F-N) tunneling effect using the electric field between the p-type well region 53 and the main floating gates MFG. In addition, the outermost main cells sharing the outermost main gate patterns MG1 and MGn according to some embodiments of the present invention may exhibit improved erasure characteristics due to the third erasure voltage Ve3 being lower than the second erasure voltage Ve2.

Figure 4:
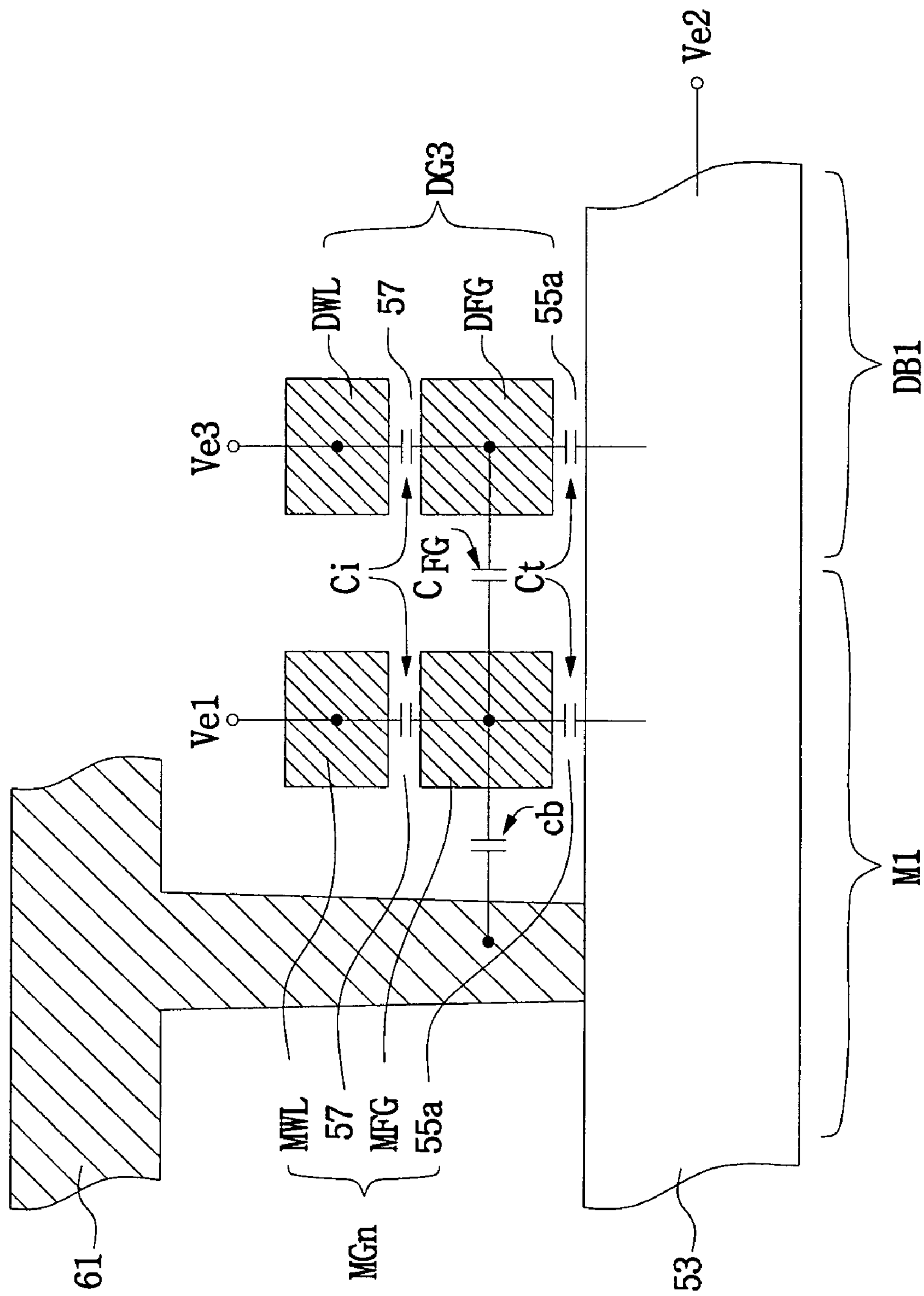
FIG. 4 is a cross-section including an equivalent circuit illustrating a coupling ratio of an outermost main cell of the NOR-type flash memory device illustrated in FIG. 3.

Referring now to FIG. 4, a cross-sectional view including an equivalent circuit illustrating a coupling ratio of the outermost main cell sharing the nth main gate pattern MGn illustrated in FIG. 3 will be discussed. As illustrated in FIG. 4, a first capacitor Ci is provided between the main word line MWL and the main floating gate MFG of the nth main gate pattern MGn. A second capacitor Ct is provided between the main floating gate MFG and the p-type well region 53. Accordingly, the first and second capacitors Ci and Ct are connected in series. The first capacitor Ci is a parasitic capacitance corresponding to the inter-gate insulating layer 57 and the second capacitor Ct is a parasitic capacitance corresponding to the tunnel insulating layer 55*a*. Similarly, the dummy cell adjacent to the outermost main cell also includes parasitic capacitances. In other words, a first parasitic capacitance, which is the same as the first capacitor Ci, is provided between the dummy word line DWL and the dummy floating gate DFG of the third dummy gate pattern DG3, and a second parasitic capacitance, which is the same as the second capacitor Ct, is provided between the dummy floating gate DFG and the p-type well region 53. As further illustrated in FIG. 4, a floating gate capacitor $C_{FG}$ is provided between the main floating gate MFG and the dummy floating gate DFG, and a bit line capacitor Cb is provided between the main floating gate MFG and the bit line 61 adjacent thereto.

As described above with respect to FIG. 3, the first erasure voltage Ve1 is applied to the main word line MWL of the nth main gate pattern MGn during the erasing operation, the second erasure voltage Ve2 is applied to the p-type well region 53, and the third erasure voltage Ve3 is applied to the dummy word line DWL of the third dummy gate pattern DG3. In these embodiments of the present invention, the floating gate voltage VFG induced at the main floating gate MFG of the nth main gate pattern MGn, i.e., the outermost main gate pattern, can be expressed by the following equation:

$$VFG=Rf\times Va+Ria\times Ve1+Rta\times Ve2 \quad \text{(Equation 2)}$$

where, Rf, Ria, Rta, and Va can be expressed by the following equation:

$$Rf=C3\div(C1+C2+C3+C4) \quad \text{(Equation 3)}$$

$$Ria=C1\div(C1+C2+C3+C4) \quad \text{(Equation 4)}$$

$$Rta=C2\div(C1+C2+C3+C4) \quad \text{(Equation 5)}$$

$$Va=Rib\times Ve3+Rtb\times Ve2 \quad \text{(Equation 6)}$$

Rib and Rtb of Equation 6 can be expressed by the following equations:

$$Rib=C1\div(C1+C2+C3) \quad \text{(Equation 7)}$$

$$Rtb=C2\div(C1+C2+C3) \quad \text{(Equation 8)}$$

In equations 3 through 8, C1 denotes a capacitance of the first capacitor Ci illustrated in FIG. 4, C2 denotes a capacitance of the second capacitor Ct illustrated in FIG. 4, C3 denotes a capacitance of the floating gate capacitor $C_{FG}$ illustrated in FIG. 4, and C4 denotes a capacitance of the bit line capacitor Cb illustrated in FIG. 4.

It will be understood from the Equations 2 through 8 that the floating gate voltage VFG may be changed with respect to the third erasure voltage Ve3. For example, in the event that the third erasure voltage Ve3 is lower than the second erasure voltage Ve2, the floating gate voltage VFG may be lower than the floating gate voltage of conventional devices having the equivalent of the third erasure voltage Ve3 being identical to the second erasure voltage Ve2. In other words, according to some embodiments of the present invention, the voltage difference between the main floating gates MFG and the p-type well region 53 of the outermost main cells may be increased as compared to conventional devices. Accordingly, the erase efficiency of the outermost main cells may be improved. Furthermore, since all of the main cells in the main cell array region M1 have uniform erase threshold voltages, a range of read voltages may be increased. In other words, the possibility of a read failure may be reduced.

Figure 5:
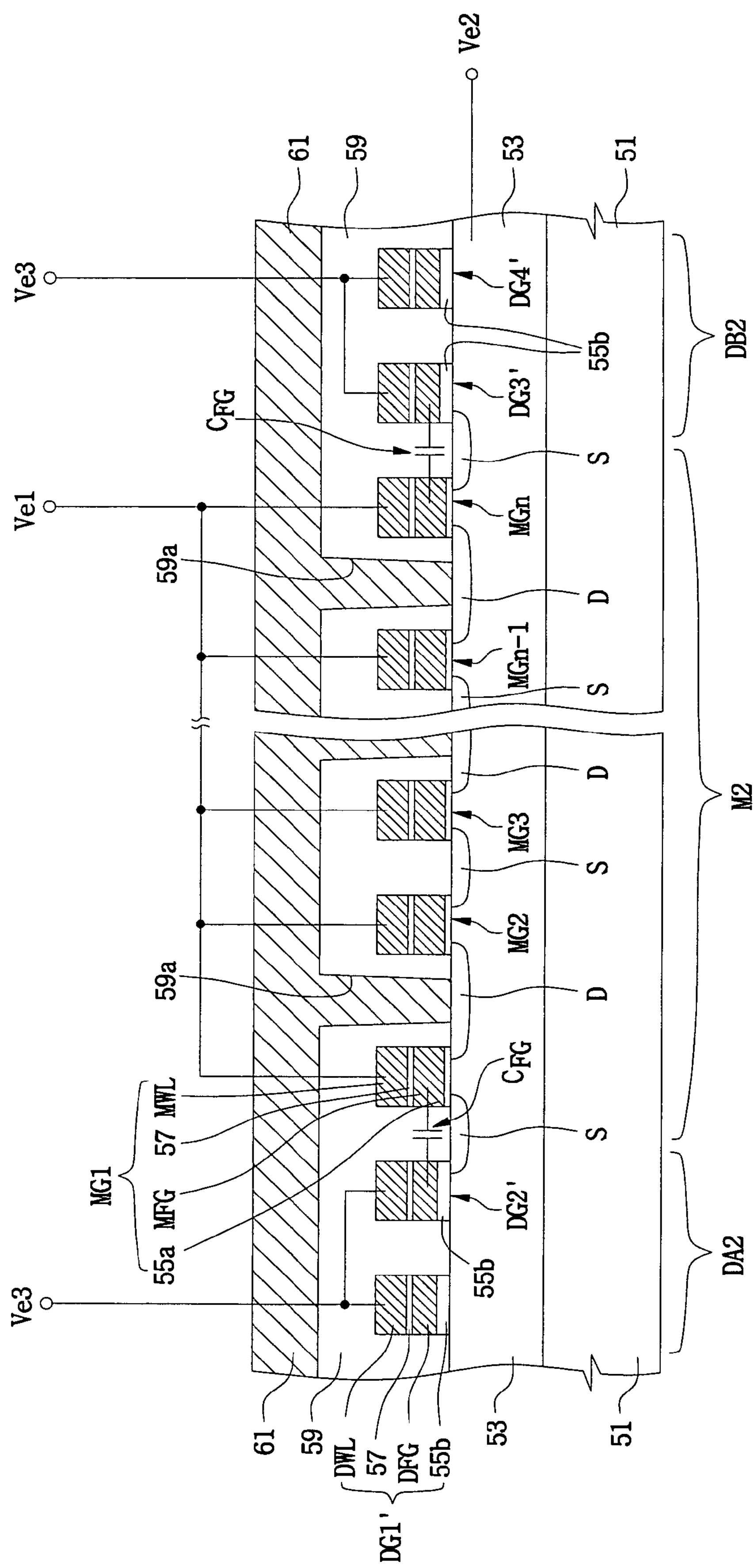
FIG. 5 is a cross-section illustrating cell regions of NOR-type flash memory devices according to further embodiments of the present invention.

Referring now to FIG. 5, a cross-sectional view illustrating an exemplary cell region of a NOR-type flash memory device according to further embodiments of the present invention will be discussed. As illustrated in FIG. 5, the integrated circuit substrate is divided into a main cell array region M2, a first dummy cell array region DA2 and a second dummy cell array region DB2. The main cell array region M2 according to embodiments of the present invention illustrated in FIG. 5 has the same structure as the main cell array region M1 illustrated in FIG. 3. However, the first and second dummy cell array regions DA2 and DB2 have a plurality of dummy gate patterns DG1', DG2', DG3' and DG4' different from the dummy gate patterns DG1, DG2, DG3 and DG4 illustrated in FIG. 3.

In particular, each of the dummy gate patterns DG1', DG2', DG3' and DG4' illustrated in FIG. 5 includes a dummy tunnel insulating layer 55*b* that is thicker than the tunnel insulating layer 55*a* of the main cells. In embodiments of the present invention illustrated in FIG. 5, even if the third erasure voltage Ve3 applied to the dummy word lines DWL of the dummy gate patterns DG1', DG2', DG3' and DG4' is lower than the second erasure voltage Ve2, the thicker dummy tunnel insulating layer 55*b* may reduce the likelihood that the dummy cells will be over-erased.

Over erasure of the dummy cells can occur due to the fact that the dummy cells are typically not selected even during operation of the main cells. In other words, the dummy cells can be over-erased, since only the erasing conditions are applied to the dummy cells. If the dummy cells are over-erased, the dummy floating gates DFG may include a plurality of holes, which may cause the dummy floating gates DFG to have unstable electric potential. If the dummy floating gates DFG have an unstable electric potential it may cause the outermost main cells to malfunction. The malfunction may be caused by coupling capacitors, for example, floating gate capacitors $C_{FG}$ between the floating gates MFG of the outermost main cells and the dummy floating gates DFG adjacent thereto. The possibility that the dummy cells according to embodiments of the present invention will be over erased may be reduced, due to the fact that the tunnel insulating layer 55*b* of the dummy cells is thicker than the main tunnel insulating layer 55*a*. Accordingly, the number of malfunctions of the outermost main cells may be reduced.

The dummy tunnel insulating layer 55*b* may be the same material layer as a gate insulating layer of high voltage metal oxide semiconductor (MOS) transistor in a peripheral circuit region (not shown). In some embodiments of the present invention, the dummy tunnel insulating layer 55*b* and the high voltage gate insulating layer may be thermal oxide layers.

Figure 6:
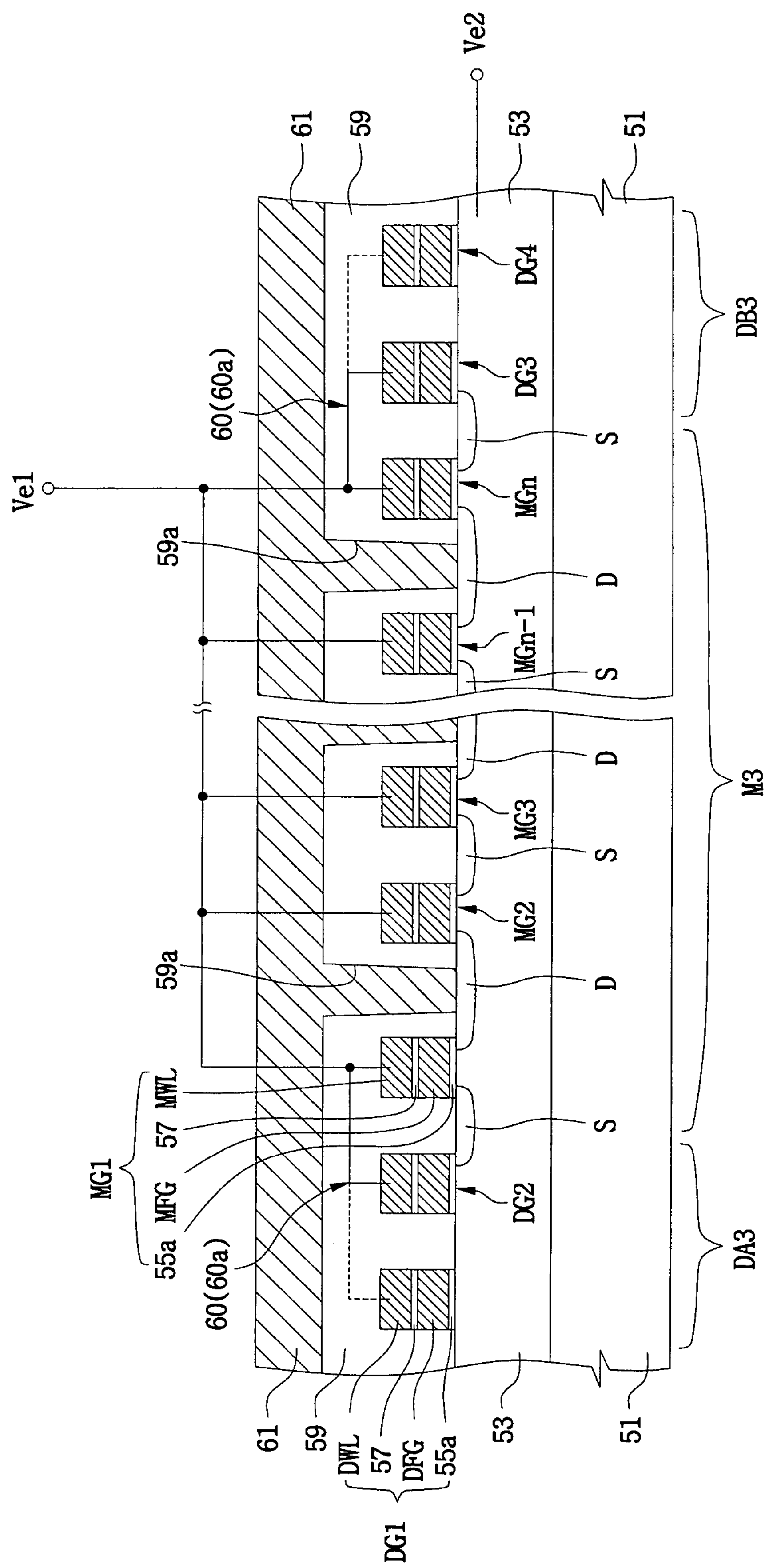
FIG. 6 is a cross-section illustrating cell regions of NOR-type flash memory devices according still further embodiments of the present invention.

Referring now to FIG. 6, a cross-sectional view illustrating a cell region of NOR-type flash memory devices according to further embodiments of the present invention will be discussed. As illustrated in FIG. 6, the integrated circuit substrate 51 is divided into a main cell array region M3, a first dummy cell array region DA3 and a second dummy cell array region DB3. The main cell array region M3, and the first and second dummy cell array regions DA3 and DB3 of embodiments of the present invention illustrated in FIG. 6 has the same structure as the main cell array region M1 and the first and second dummy cell array regions DA1 and DB1, respectively, illustrated in FIG. 3. However, embodiments of the present invention illustrated in FIG. 6 are characterized in that the first and second outermost main control gate electrodes, for example, the main word lines of the first and nth main gate patterns MG1 and MGn, are electrically coupled to at least the first and second inner dummy control gate electrodes, for example, the dummy word lines of the second and third dummy gate patterns DG2 and DG3 through local interconnection lines 60 or 60*a*, respectively. The local interconnection lines 60 or 60*a* may be extended so that they are electrically coupled to all of the dummy control gate electrodes in the first and second dummy cell array regions DA3 and DB3.

Accordingly, at least the first and second inner dummy control gate electrodes have the same electric potential, for example, the first erasure voltage Ve1, as the main control gate electrodes during the programming operation as well as the erasing operation according to some embodiments of the present invention. Thus, even if the tunnel insulating layer of the dummy cells have the same thickness as the tunnel insulating layer 55*a* of the main cells as illustrated in FIG. 6, the dummy cells may not be over-erased.

Figure 7A:
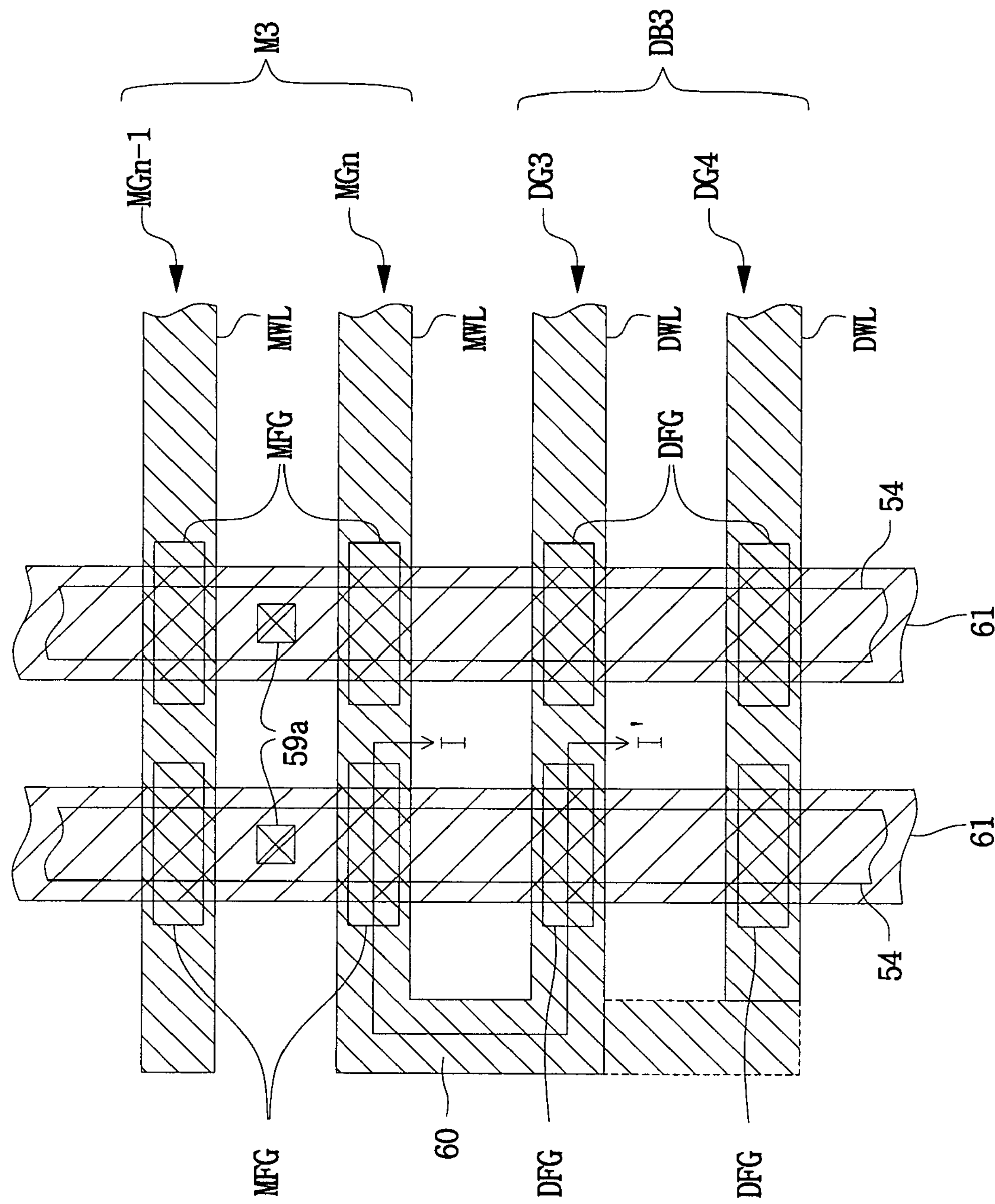
FIG. 7A is a top plan view illustrating a layout structure of NOR-type flash memory devices according to embodiments of the present invention illustrated in FIG. 6.
Figure 7B:
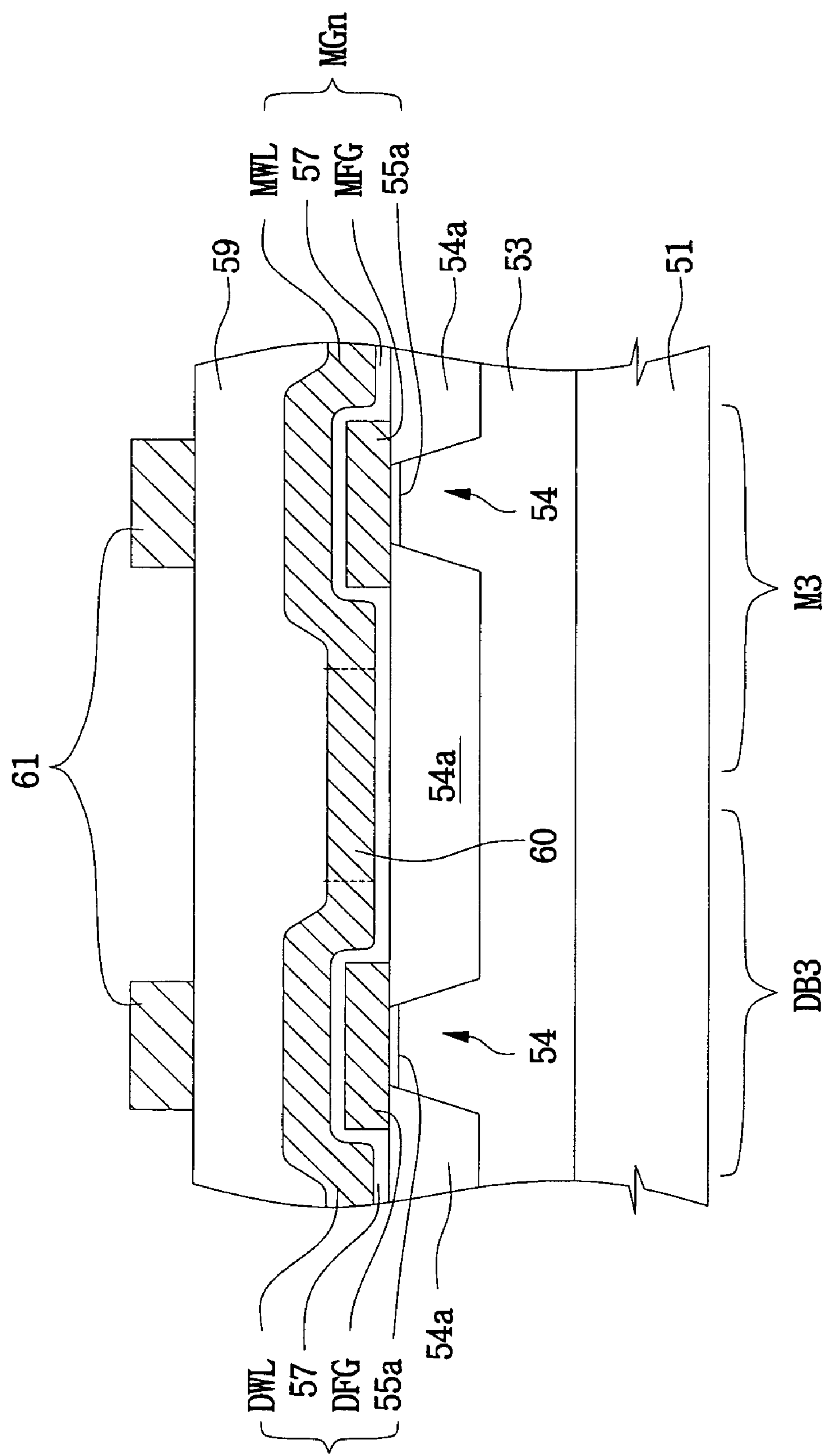
FIG. 7B is a cross-section taken along the line I–I' of FIG. 7A illustrating NOR-type flash memory devices according to embodiments of the present invention illustrated in FIG. 6.

Referring now to FIGS. 7A and 7B. FIG. 7A is a top plan view illustrating a layout that is suitable for realization of the local interconnection lines 60 illustrated in FIG. 6, and FIG. 7B is a cross-sectional view taken along the line I–I' of FIG. 7A. In FIGS. 7A and 7B, the regions indicated by the reference numeral "54" represent active regions, and a region indicated by the reference numeral "54*a*" represents a device isolation layer that defines the active regions.

As illustrated in FIGS. 7A and 7B, one of the local interconnection lines 60 extends from one end of the main word line MWL (the second outermost main control gate electrode) of the nth main gate pattern MGn, thereby contacting one end of the dummy word line DWL (the second inner dummy control gate electrode) of at least the third dummy gate pattern DG3 of the second group of dummy gate patterns DG3 and DG4 adjacent to the second outermost main control gate electrode. Similarly, though not shown in the drawings, the other one of the local interconnection lines 60 extends from one end of the main word line MWL (the first outermost main control gate electrode) of the first main gate pattern MG1, thereby contacting one end of the dummy word line DWL (the first inner dummy control gate electrode) of at least the second dummy gate pattern DG2 of the first group of dummy gate patterns DG1 and DG2 adjacent to the first outermost main control gate electrode. As a result, the local interconnection lines 60 electrically connect the outermost main control gate electrodes to at least the inner dummy control gate electrodes under the interlayer insulating layer 59. In this case, the local interconnection lines 60 may include the same material layer as the main word lines MWL and the dummy word lines DWL.

Figure 8A:
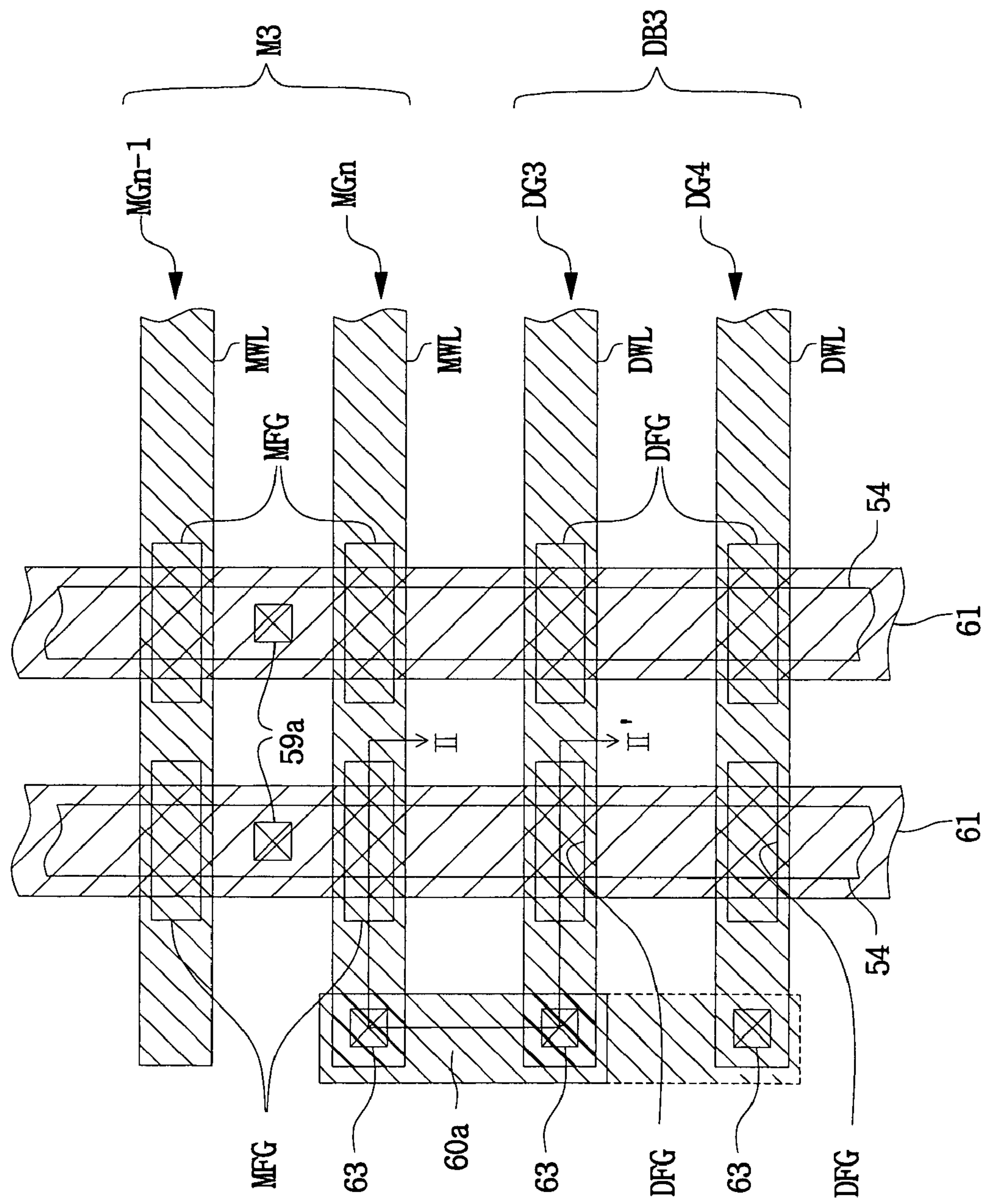
FIG. 8A is a top plan view illustrating a layout structure of NOR-type flash memory devices according to embodiments of the present invention illustrated in FIG. 6.
Figure 8B:
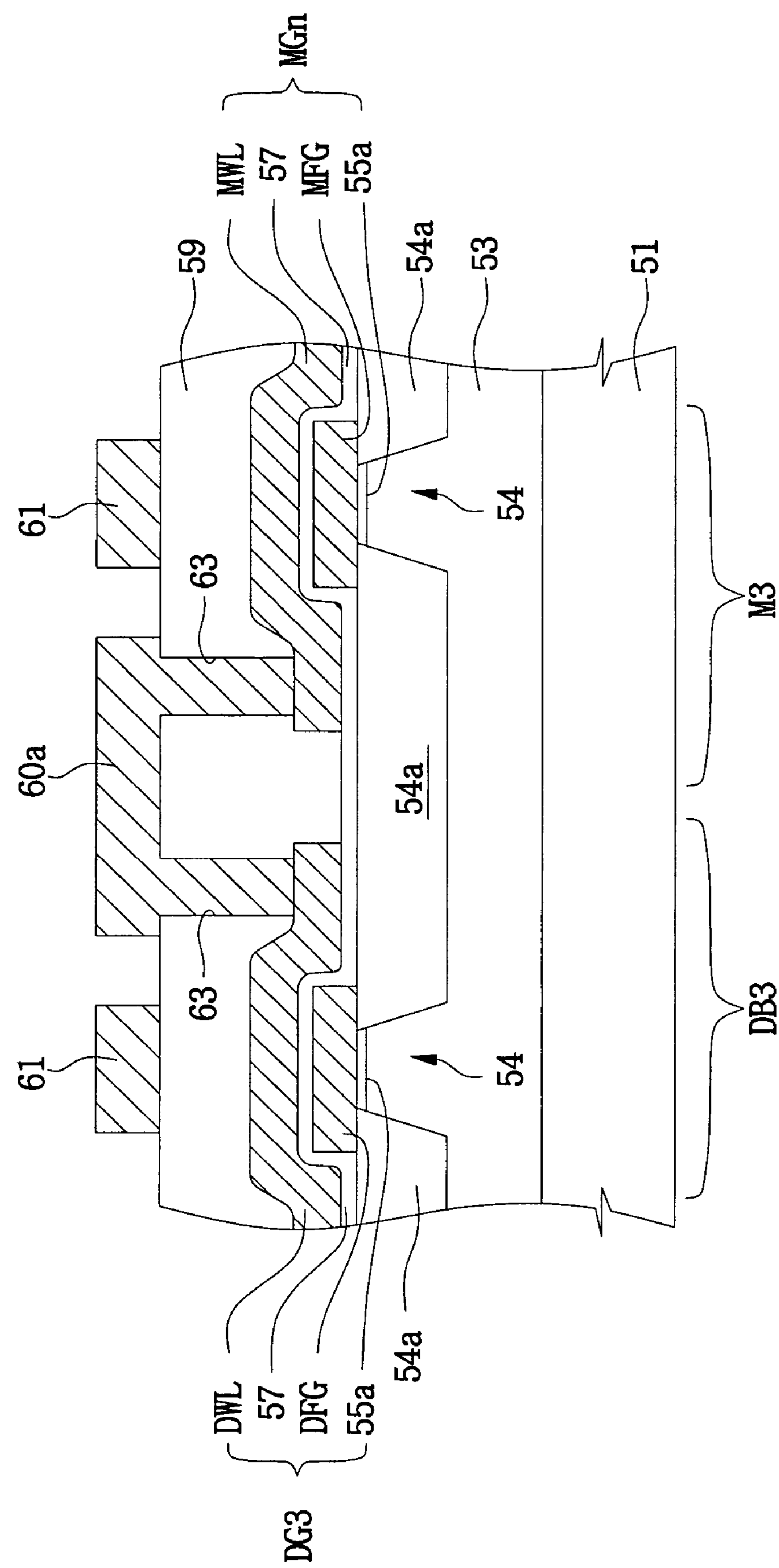
FIG. 8B is a cross-section taken along the line II–II' of FIG. 8A illustrating NOR-type flash memory devices according to embodiments of the present invention illustrated in FIG. 6.

Referring now to FIGS. 8A and 8B. FIG. 8A is a top plan view illustrating a layout that is suitable for realization of the local interconnection lines 60*a* illustrated in FIG. 6, and FIG. 8B is a cross-sectional view taken along the line II–II' of FIG. 8A. As illustrated in FIGS. 8A and 8B, one of the local interconnection lines 60*a* is disposed on the interlayer insulating layer 59, and both ends of the local interconnection line 60*a* are electrically connected to one end of the second outermost main control gate electrode and one end of the second inner dummy control gate electrode through contact holes 63 in the interlayer insulating layer 59, respectively. Similarly, though not shown in the drawings, the other one of the local interconnection lines 60*a* is also disposed on the interlayer insulating layer 59, and both ends of the other local interconnection line 60*a* are electrically connected to one end of the first outermost main control gate electrode and one end of the first inner dummy control gate electrode through other contact holes in the interlayer insulating layer 59, respectively. In this case, the local interconnection lines 60*a* may be the same material layer as the bit lines 61.

Figure 9:
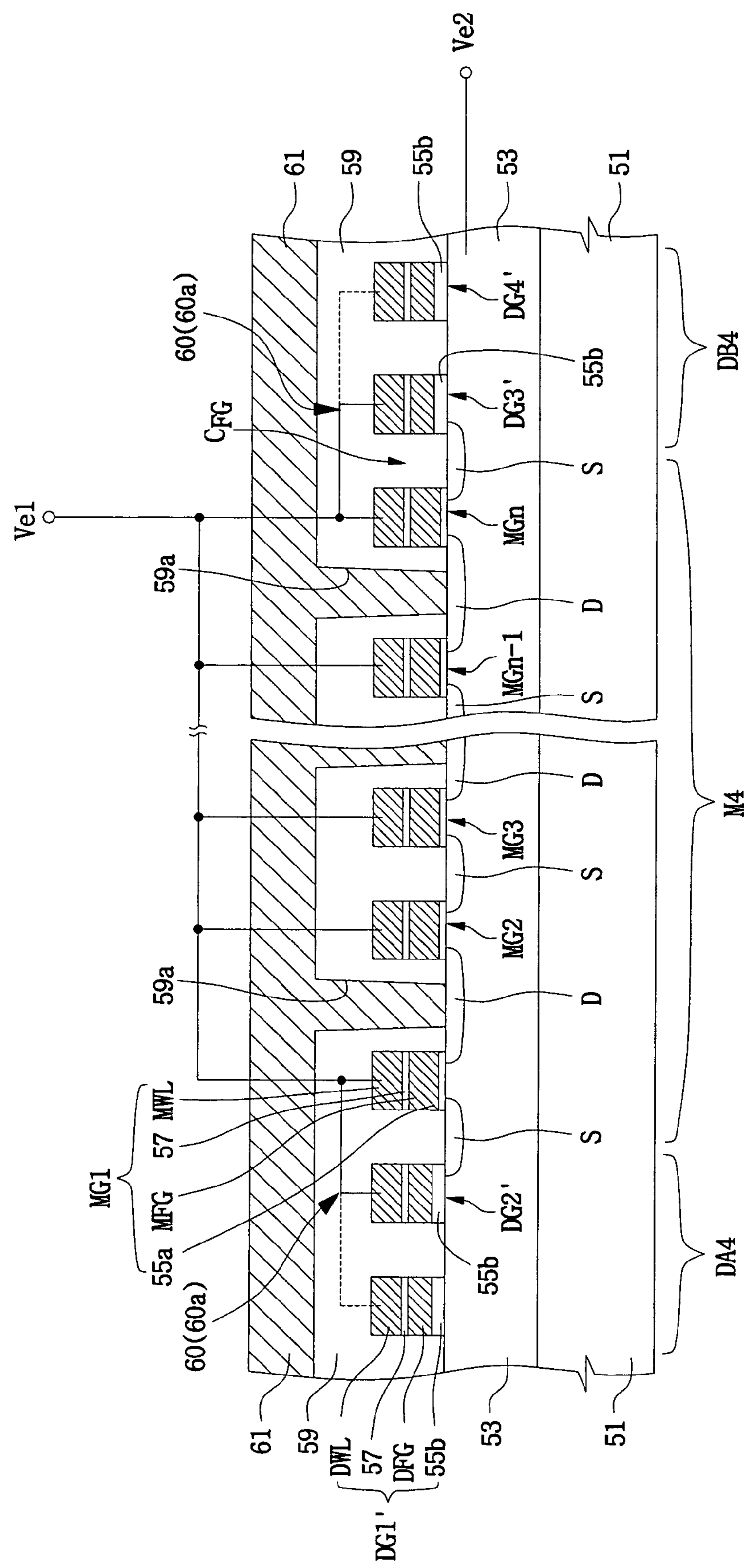
FIG. 9 is a cross-section illustrating cell regions of NOR-type flash memory devices according to further embodiments of the present invention.

Referring now to FIG. 9, a cross-sectional view illustrating a cell region of a NOR-type flash memory devices according to some embodiments of the present invention will be discussed. As illustrated in FIG. 9, the integrated circuit substrate defines a main cell array region M4, a first dummy cell array region DA4 and a second dummy cell array region DB4. The main cell array region M4 according to embodiments of the present invention illustrated in FIG. 9 has the same structure as the main cell array region M2 illustrated in FIG. 5. Furthermore, the first and second dummy cell array regions DA4 and DB4 according to embodiments of the present invention illustrated in FIG. 9 have the same structures as the first and second dummy cell array regions DA2 and DB2, respectively, illustrated in FIG. 5. The embodiments illustrated in FIG. 9 further include local interconnection lines 60 or 60*a* described with reference to FIGS. 6, 7A, 7B, 8A and 8B. Accordingly, the erase characteristics of the NOR-type flash memory device may be further improved. In other words, the malfunction of the outermost main cells due to the over-erasure of the dummy cells as well as the non-uniformity of the erase threshold voltage of the main cells can be improved.

Figure 10:
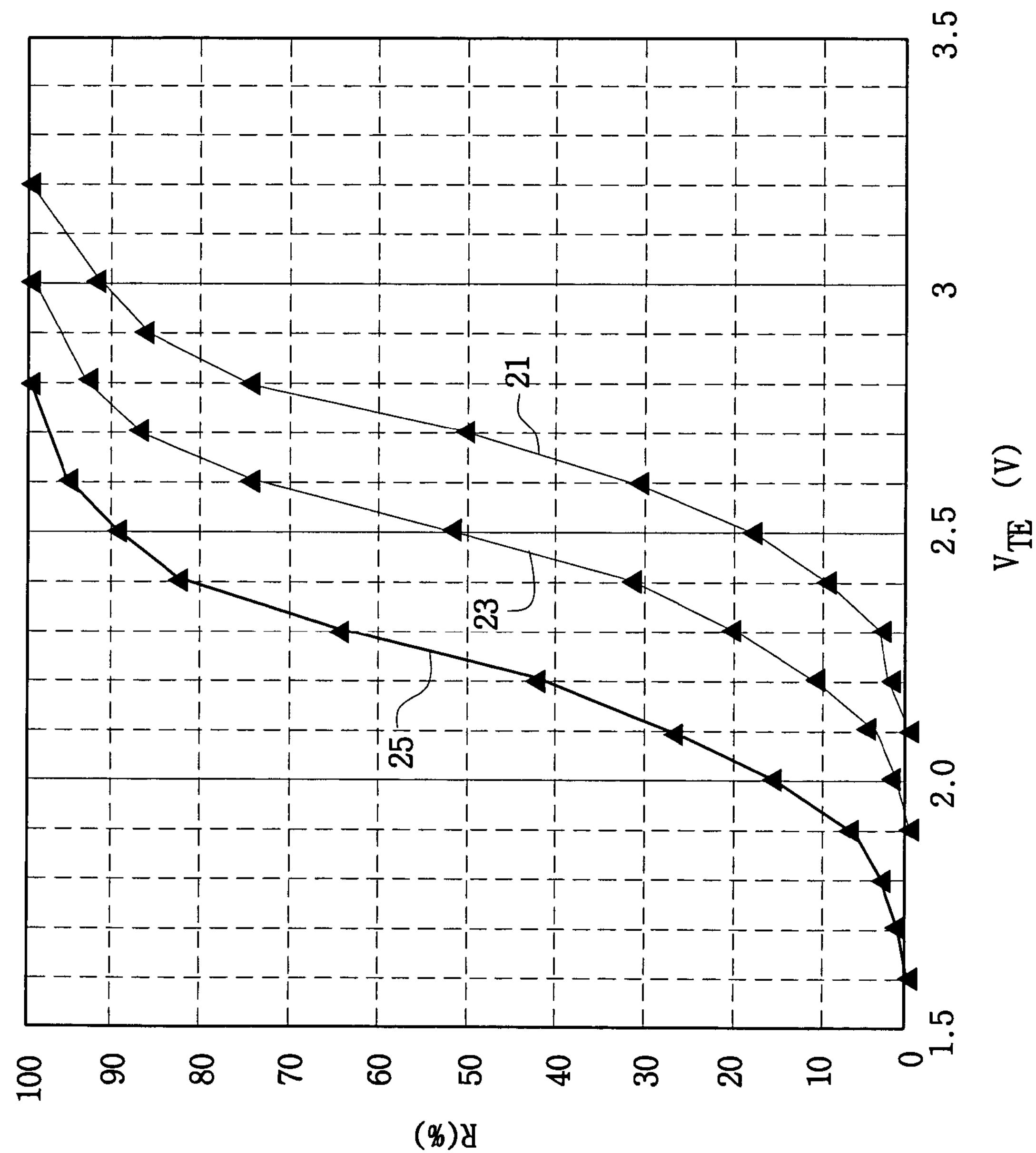
FIG. 10 is a graphical representation illustrating measurement results of threshold voltages of outermost main cells erased using erasing methods according to still further embodiments of the present invention relative to conventional erasing methods.

Referring now to FIG. 10, a graph illustrating measurement results of threshold voltages of the outermost main cells of the NOR-type flash memory device erased using conventional erasing methods and the erasing methods according to some embodiments of the present invention will be discussed. As illustrated in FIG. 10, the horizontal axis represents an erase threshold voltage $V_{TE}$, and the vertical axis represents a cumulative distribution rate R. A curve 21 shows the erase threshold voltages of the samples erased using conventional erasing methods, and curves 23 and 25 show the erase threshold voltages of the samples erased using the erasing methods according to some embodiments of the present invention. Each of the curves 21, 23 and 25 shows the measurement results of one hundred and thirty outermost main cells.

The main cells and the dummy cells of conventional NOR-type flash memory devices according to some embodiments of the present invention used in the generation of FIG. 10 were fabricated to have an O/N/O layer as the inter-gate insulating layer and an oxide layer as the tunnel insulating layer. The O/N/O layer was formed to have an equivalent oxide thickness of 155 Å, and the tunnel oxide layer was formed to have a thickness of 83 Å. Also, a first erasure voltage of negative 9 volts was applied to the main word lines and a second erasure voltage of positive 7 volts was applied to the p-type well region in the cell array region as well as a pair of dummy word lines placed at both sides of the main word lines in order to perform the conventional erasing operation. The first and second erasure voltages were applied for 10 milliseconds.

The erasing method according to some embodiments of the present invention was achieved by respectively applying a first erasure voltage of negative 9 volts and a second erasure voltage of positive 7 volts to the main word lines and the p-type well region, and applying a third erasure voltage of 0 volts to the pair of dummy word lines disposed at both sides of the main word lines. In addition, the erasing method according to further embodiments of the present invention was achieved by respectively applying a first erasure voltage of negative 9 volts and a second erasure voltage of positive 7 volts to the main word lines and the p-type well region, and applying a third erasure voltage of negative 9 volts to the pair of dummy word lines disposed at both sides of the main word lines. The erasing operations according to the embodiments of the present invention were also performed for 10 milliseconds.

Referring again to FIG. 10, the outermost main cells erased using the conventional method exhibited the erase threshold voltages within the range of from about 2.1 to about 3.2 volts. In contrast, the outermost main cells erased using some embodiments of the present invention exhibited the erase threshold voltages within the range of from about 1.9 to about 3 volts. Further, the outermost main cells erased using the further embodiments of the present invention exhibited the erase threshold voltages within the range of from about 1.6 to about 2.8 volts. Accordingly, the erasing methods according embodiments of the present invention may improve the erase characteristics of the outermost main cells relative to the conventional erasing method.

As discussed briefly above with respect to FIGS. 3 through 10, integrated circuit memory devices including a main cell array region and first and second dummy cell array regions on either side of the main cell array region are provided. A first erasure voltage is applied to a plurality of main control gate electrodes in a main cell array region, a second erasure voltage is applied to an integrated circuit substrate in the main cell array region and a third erasure voltage is applied to a first inner dummy control gate electrode and a second inner dummy control gate electrode. The third eraser voltage applied to the first and second inner dummy control gate electrodes is lower than the second voltage applied to the integrated circuit substrate. Accordingly, the erase threshold voltages of the main cells are lowered, which may increase a read margin of the integrated circuit memory device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of erasing an integrated circuit memory device comprising:

applying a first erasure voltage to a plurality of main control gate electrodes in a main cell array region;

applying a second erasure voltage to a well region of an integrated circuit substrate in the main cell array region, the second erasure voltage being greater than the first erasure voltage; and applying a third erasure voltage to a first inner dummy control gate electrode and a second liner dummy control gate electrode, the third erasure voltage being less than the second erasure voltage.

2. The method of claim 1, wherein the first erasure voltage comprises a negative voltage and wherein the second erasure voltage comprises a positive voltage.

3. The method of claim 2, wherein the third erasure voltage is substantially equal to the first erasure voltage.

4. The method of claim 2, wherein the third erasure voltage is greater than the first erasure voltage.

5. The method of claim 1, wherein the first erasure voltage comprises negative 7 volts and wherein the second erasure voltage is about positive 9 volts.

6. The method of claim 5, wherein the third erasure voltage is about negative 7 volts.

7. The method of claim 5, wherein the third erasure voltage is greater than about negative 7 volts and is less than about 0 volts.

8. A method of erasing an integrated circuit memory device having a cell ray region that includes a main cell array region, a first dummy cell array region on a first side of the main cell array region and a second dummy cell array region on a second side of the main cell array region and separate from the first dummy cell may region, the method comprising:

applying a first erasure voltage to a plurality of main control gate electrodes in the main cell array region, the plurality of main control gate electrodes including a first outermost main control gate electrode adjacent to the first dummy cell array region and a second outermost main control gate electrode adjacent to the second dummy cell array region;

applying a second erasure voltage to a well region of an integrated circuit substrate in the main cell may region, the second erasure voltage being greater than the first erasure voltage; and applying a third erasure voltage to a first inner dummy control gate electrode adjacent to the first outermost main control gate electrode and a second inner dummy control gate electrode adjacent to the second outermost main control gate electrode, the third erasure voltage being less than the second erasure voltage.

9. The method of claim 8, wherein the first erasure voltage comprises a negative voltage and wherein the second erasure voltage comprises a positive voltage.

10. The method of claim 9, wherein the third erasure voltage is substantially equal to the first erasure voltage.

11. The method of claim 9, wherein the third erasure voltage is greater than the first erasure voltage.

12. The method of claim 8, wherein the first erasure voltage is about negative 7 volts and wherein the second erasure voltage is about positive 9 volts.

13. The method of claim 12, wherein the third erasure voltage is about negative 7 volts.

14. The method of claim 12, wherein the third erasure voltage is greater than about negative 7 volts and is less than about 0 volts.

15. The method of claim 8, wherein the memory device further includes a first outer dummy control gate electrode adjacent to the first inner dummy control gate electrode and a second outer dummy control gate electrode adjacent to the second inner dummy control gate electrode and wherein applying the third erasure voltage comprises applying the third erasure voltage to the first and second inner dummy control gate electrodes and the first and second outer dummy cell array regions.

16. The method of claim 8, wherein the integrated circuit comprises a p-type integrated circuit substrate.

* * * * *

UNITED STATES PATENT AND TRADEMARK OFFICE

CERTIFICATE OF CORRECTION

PATENT NO. : 7,158,419 B2
APPLICATION NO. : 10/918966
DATED : January 2, 2007
INVENTOR(S) : C. Lee et al.

It is certified that error appears in the above-identified patent and that said Letters Patent is hereby corrected as shown below:

Title Page

Item 74: Change to: --Myers Bigel Sibley & Sajovec P.A.--

Column 3,

Line 26: Change to: --*Nonvolatile Memory and Its Address System.*--

Column 13,

Line 14: "and a second liner dummy" Change to: --and a second inner dummy--

Line 33: "device having a cell ray" Change to: --device having a cell array--

Line 37: "first dummy cell may" Change to: --first dummy cell array--

Column 14,

Line 5: "in the main cell may region," Change to: --in the main cell array region,--

Signed and Sealed this

Tenth Day of April, 2007

JON W. DUDAS
*Director of the United States Patent and Trademark Office*